(12) United States Patent
Hasegawa et al.

(10) Patent No.: US 6,329,820 B1
(45) Date of Patent: Dec. 11, 2001

(54) NMR PROBE

(75) Inventors: Kenichi Hasegawa; Yoshiaki Yamakoshi, both of Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 09/451,308

(22) Filed: Nov. 29, 1999

(30) Foreign Application Priority Data

Nov. 19, 1998 (JP) ................................................. 10-337507

(51) Int. Cl.[7] .................................................... G01V 3/00
(52) U.S. Cl. ........................................... 324/315; 324/321
(58) Field of Search ................................. 324/315, 321, 324/322, 318, 300, 307

(56) References Cited

U.S. PATENT DOCUMENTS

| | | | | |
|---|---|---|---|---|
| 4,266,194 | * | 5/1981 | Hlavka | 324/315 |
| 5,262,727 | * | 11/1993 | Behbin et al. | 324/318 |
| 5,530,353 | * | 6/1996 | Blanz | 324/315 |

FOREIGN PATENT DOCUMENTS 09269364   10/1997  (JP).

* cited by examiner

Primary Examiner—Louis Arana
(74) Attorney, Agent, or Firm—Webb Ziesenheim Logsdon Orkin & Hanson, P.C.

(57) ABSTRACT

There is disclosed an NMR (nuclear magnetic resonance) probe having a support that produces no NMR background signal, has heat resistance, does not distort homogeneous static magnetic field, has a low dielectric loss, and is easy to machine. The NMR probe has a sample bobbin on which a detector coil is mounted, as well as the support described above. The support holds the sample bobbin. The support is plated with a metal to prevent generation of NMR background signals. The support has a bushing equipped with a hole having a diameter substantially equal to that of an extraction line extending from the detector coil. The hole passes the extraction line. The bushing is made of an insulative material of a low magnetic susceptibility. Thus, leakage of air from the hole is prevented. At the same time, the support and the extraction line are electrically insulated from each other.

15 Claims, 10 Drawing Sheets

NMR PROBE

BACKGROUND OF THE INVENTION

1. Field of the Invention

The present invention relates to a nuclear magnetic resonance (NMR) spectrometer and, more particularly, to an NMR probe which is placed within a static magnetic field while holding a sample therein and which permits irradiation of the sample by RF pulses and detection of the resulting NMR signal.

2. Description of the Related Art

An NMR probe is a device used for detection of an NMR signal. In use, it is inserted in a high field magnet, such as a superconducting magnet. Since the static magnetic field applied to the NMR probe is required to have a high degree of homogeneity, the NMR probe is entirely made of a material having a low magnetic susceptibility to prevent distortion of the static magnetic field.

FIG. 1 shows main portions of the prior art NMR probe. A support 1 is located at the top of the NMR probe and acts to hold a coil bobbin 3 on which a detector coil 2 is mounted. The coil 2 is used to detect an NMR signal. An extraction line a that is a signal line extends from the detector coil 2. The support 1 is provided with a hole b to pass the extraction line a. This line is electrically connected with an electric circuit portion c mounted at the bottom of the support 1.

A cold gas and a hot gas for varying the temperature are admitted into the space surrounded by the support 1 and the double tube coil bobbin 3 via a glass tube 4 to investigate a sample tube d at different temperatures. Since it is necessary to vent the gases without leakage, the hole b for passing the extraction line a laid in the support 1 is normally filled with an adhesive. Thus, the portion surrounding the sample tube d is closed.

In this structure, the extraction line a passes through the support 1. In spite of this, the support 1 is required not to produce any background signal that cannot be distinguished from the NMR signal arising from the sample. Furthermore, the support is required to have sufficient heat resistance such that it does not deform even if it is exposed to cold and hot gases during measurements under variable-temperature conditions. The magnetic field in the vicinities of the detector coils 2 must have a very high degree of uniformity. Where a magnetic field gradient pulse is applied during a measurement, for example, if the support 1 is made of a metallic material, an eddy current will be produced, distorting the uniformity of the static magnetic field. This will deteriorate the resolution of the NMR signal, thus hindering the measurement. Therefore, it is necessary that the support 1 be made of a nonmagnetic material producing no eddy current. If a material having a large dielectric loss is used, the Q factor of the NMR probe decreases, lowering the detection sensitivity. Consequently, a material having a small dielectric loss must be employed.

For these reasons, limitations are imposed on the usable materials today. Materials satisfying all the requirements described above are almost unavailable. Especially, with respect to the problems of NMR background, almost all materials contain $^1H$ nuclei (proton) to be investigated by NMR and so NMR background signals are detected from almost every material. Hence, the usable material is selected from a very narrow choice of materials.

For example, where the support 1 is made of Teflon, it exhibits excellent heat resistance during measurements under variable-temperature conditions and excellent machinability when the material is machined. However, the material produces a considerable amount of background signal due to $^1H$ nuclei (proton) that are main nuclei observed by NMR. Where Diflon is used, a smaller amount of background signal is produced from $^1H$ nuclei than where Teflon is used. However, the heat resistance is inferior and, therefore, the material cannot be elevated to high temperatures. Whether Teflon or Diflon is used, the hole b in the support 1 for the extraction line a is filled with an adhesive to prevent leakage of temperature-varying gases. This induces NMR background signals.

SUMMARY OF THE INVENTION

In view of the foregoing, it is an object of the present invention to provide an NMR probe having a support which produces no NMR background signal, exhibits heat resistance, does not distort the homogeneous static magnetic field, has small dielectric loss, and is easy to machine.

The above object is achieved in accordance with the teachings of the present invention by an NMR probe having a sample bobbin and a support that holds the bobbin. A detector coil is mounted on the surface of the sample bobbin. The support is plated with a metal. The support can be made of glass-epoxy, quartz glass, or other material having a low magnetic susceptibility.

To pass the extraction line taken from the detector coil, a bushing having a hole with a diameter substantially equal to that of the extraction line can be mounted in the support. The bushing can be fabricated from quartz glass or other insulative material having a low magnetic susceptibility.

The present invention also provides an NMR probe having an NMR detector coil and at least one capacitor combined with the coil. This NMR probe further includes a cylindrical grounding electrode surrounding the outside of the probe and a partition plate that partitions the inside of the grounding electrode. The partition plate consists of an insulative material coated with an electrically conductive material. The NMR detector coil described above is attached to the partition plate, which in turn is electrically connected with the inner surface of the grounding electrode. One electrode of the capacitor is mounted to the inner surface of the cylindrical electrode or to the partition plate.

Other objects and features of the invention will appear in the course of the description thereof, which follows.

DESCRIPTION OF THE PREFERRED EMBODIMENTS

Figure 1:
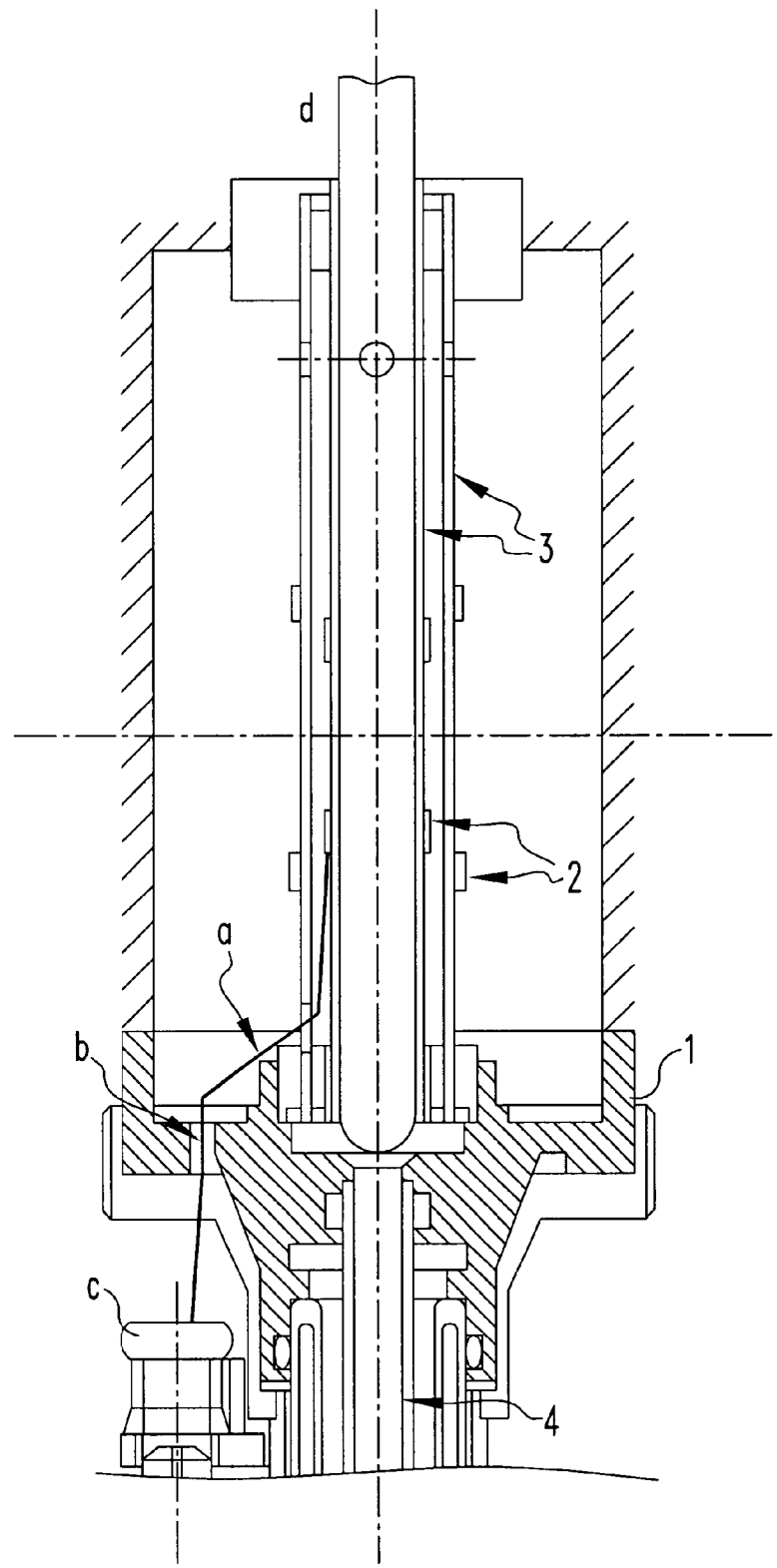
FIG. 1 is a cross-sectional view showing main portions of the prior art NMR probe.
Figure 2:
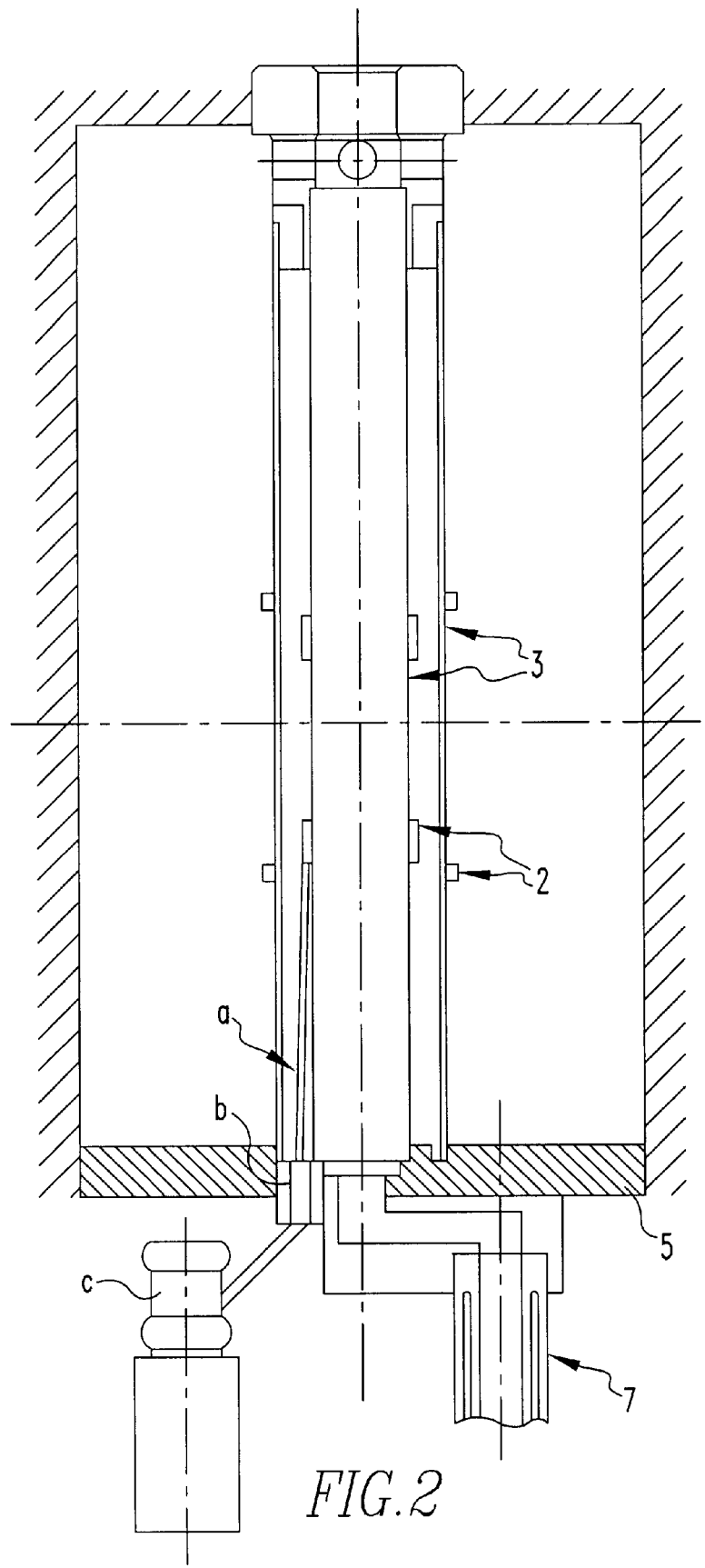
FIG. 2 is a cross-sectional view showing main portions of an NMR probe in accordance with the present invention.

The preferred embodiments of the present invention are hereinafter described with reference to the drawings. FIG. 2 shows an example of the main portion of an NMR probe in accordance with the present invention.

A support 5 is soldered to a probe cover (not shown). A glass bobbin 3 having a double tube structure is mounted on the support 5. Detector coils 2 for irradiating a sample with a radio-frequency magnetic field and detecting an NMR signal from the sample are mounted on the surfaces of the inner and outer tubes, respectively. Gases for varying the temperature are introduced into the glass bobbin 3 via a double glass tube 7. The gases for varying the temperature are vented from the probe through a separate glass tube (not shown). In this way, the temperature of the NMR sample can be varied.

An epoxy resin containing glass that is generally used as the material of electrical circuit boards is used as the material of the support 5. This secures high machinability and heat resistance during measurements under variable-temperature conditions. Under these conditions, however, NMR background signals will present problems. Therefore, the whole surface of the support including the drilled portion is plated with gold or other electrically conductive metal. In practice, the material undergoes primary processing with electroless plating (chemical plating). Then, the plating is electroplated such that the whole surface of the support is coated with a thin layer of metal plating. In consequence, the glass-epoxy resin is completely shielded from an RF magnetic field and thus generation of NMR background signals is prevented. Since the metal plating layer is very thin, it hardly affects the homogeneity of the static magnetic field and thus NMR can be measured at a high resolution.

Signal lines extending from the detector coils 2 are processed as follows. A hole sufficiently larger than the extraction line a is formed in the support 5. A bushing 6 made of quartz glass having a small dielectric loss is first forced into the hole. A hole b having a diameter substantially equal to that of the extraction line is formed in the center of the bushing 6. The extraction line a is passed through the hole b. This can prevent leakage of the gases for varying the temperature. At the same time, generation of NMR background signals is prevented. Furthermore, the extraction line a can be electrically insulated from the plating layer on the surface of the support 5.

Note that the material of the support 5 is not limited to epoxy resins containing glass. Other materials having low magnetic susceptibilities may also be used; in this case, the surface may be plated with a metal. In addition, the material of the bushing 6 is not restricted to quartz glass. The bushing may also be made of other materials.

Figure 3:
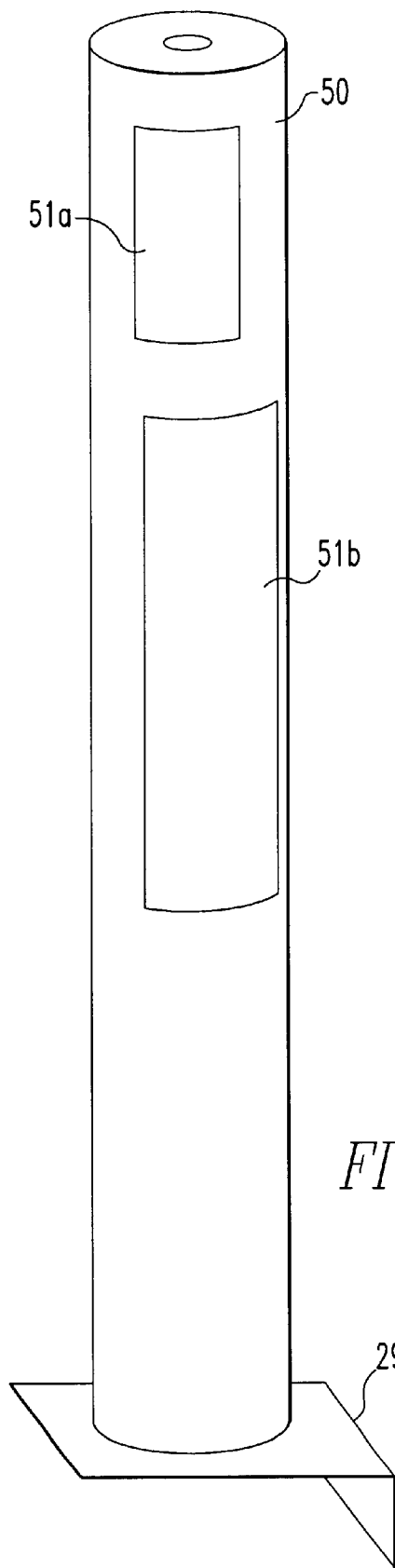
FIG. 3 is a perspective view of the frame of an NMR probe in accordance with a second embodiment of the present invention.
Figure 4A:
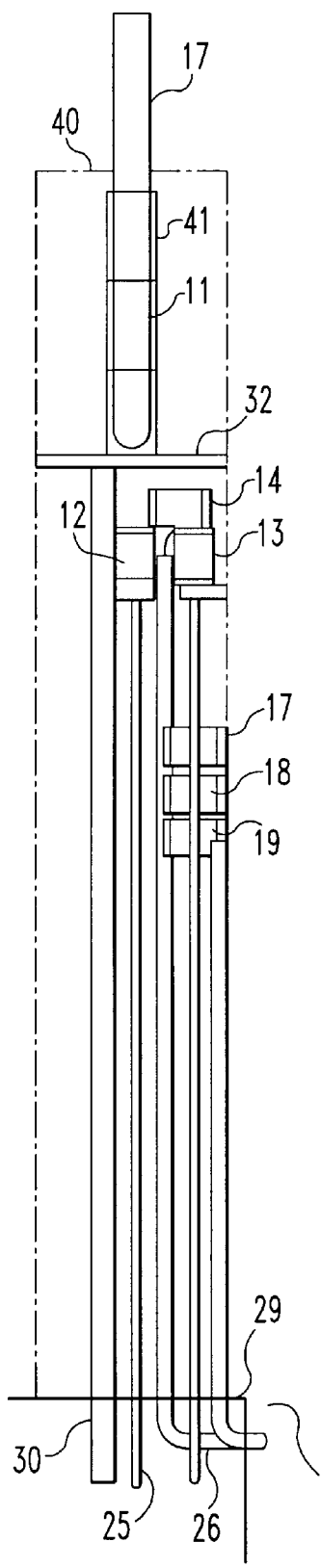
FIG. 4(a) is a cross-sectional view of the NMR probe in accordance with the second embodiment of the present invention.
Figure 4B:
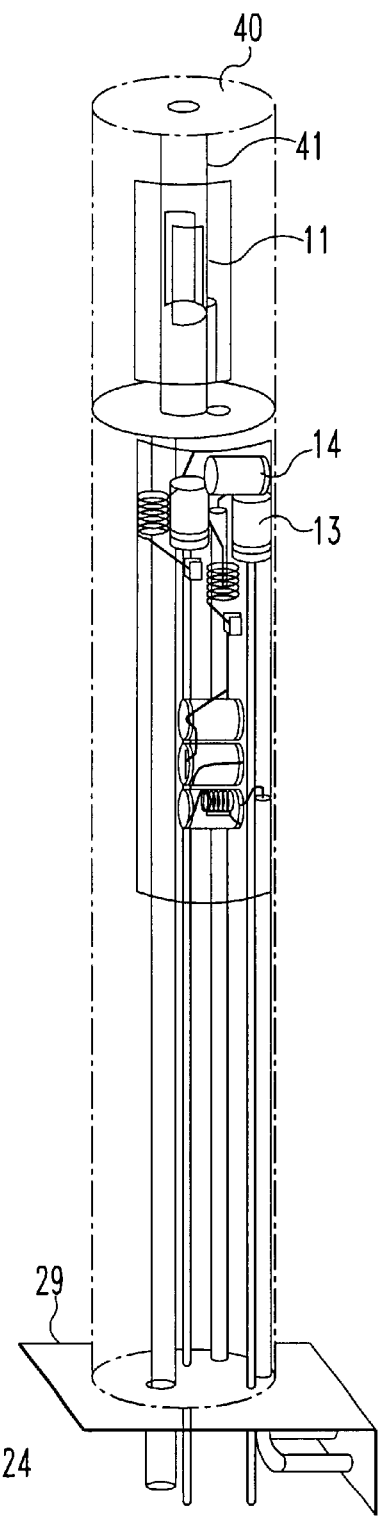
FIG. 4(b) is a stereophotographic line diagram of the NMR probe shown in FIG. 4(a)
Figure 4C:
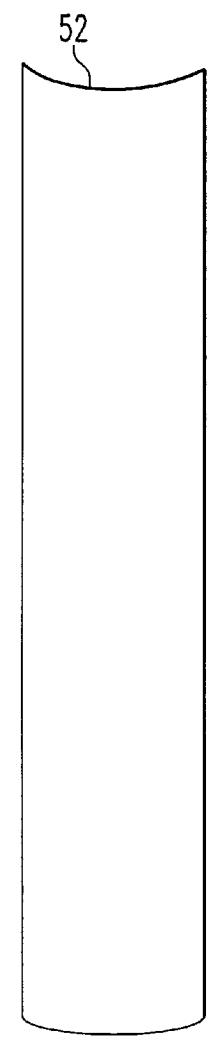
Figure 5:
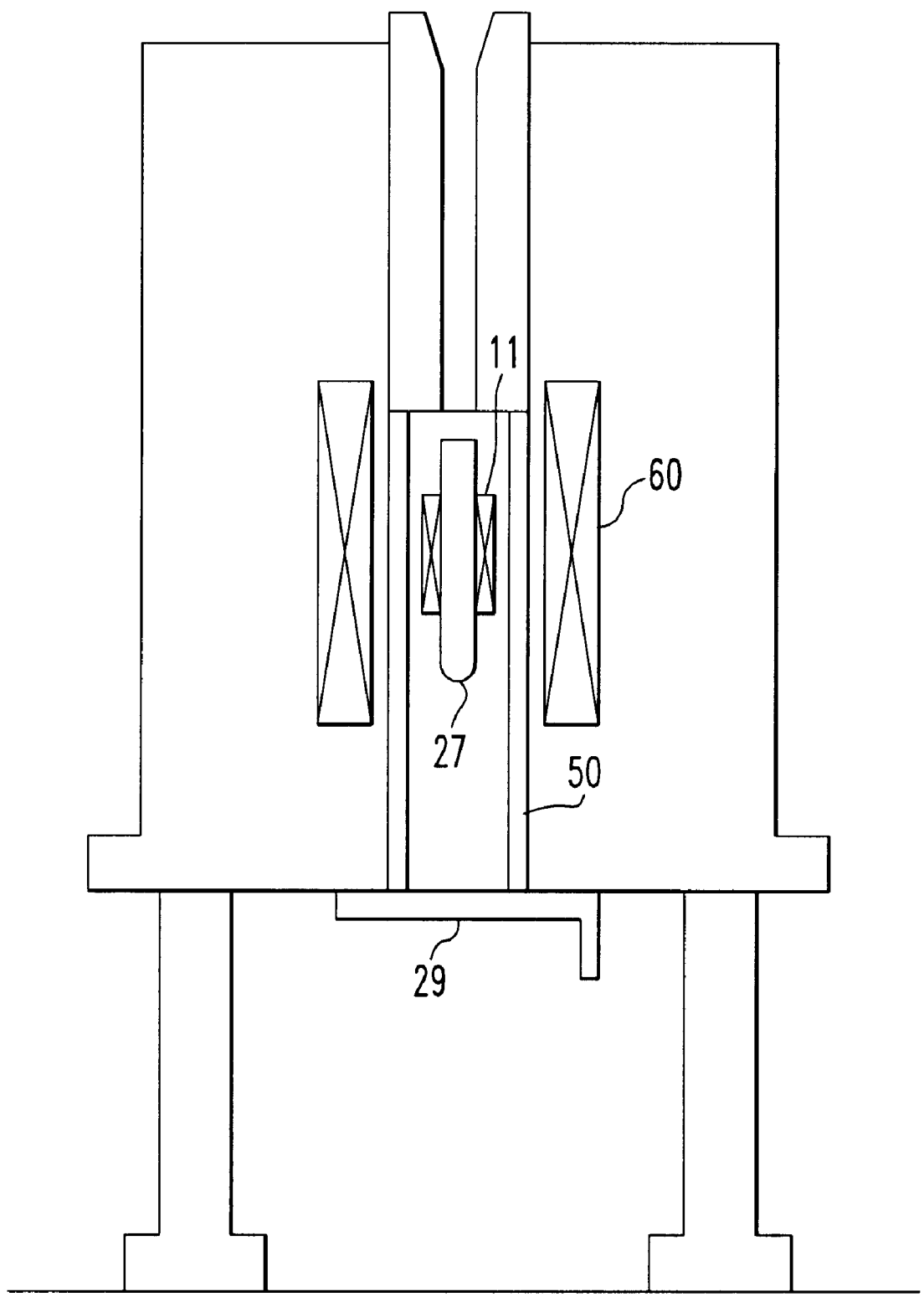
FIG. 5 is a schematic cross section showing the manner in which the probe shown in FIG. 3 has been inserted in a superconducting magnet.

Another embodiment of the present invention is hereinafter described with reference to the drawings. FIG. 3 is a perspective view showing the structure of a frame. FIG. 4(a) is a cross-sectional view. FIG. 4(b) is a stereophotographic line diagram. FIG. 5 is a cross-sectional view showing the manner in which a detector has been inserted and mounted in a superconducting magnet.

Referring to FIG. 3, a hollow cylindrical electrode 50 made of a highly conductive metal acts as a frame and also as a ground for electric circuitry. An electric circuit as shown in FIG. 6 is inserted in the electrode 50.

Figure 6:
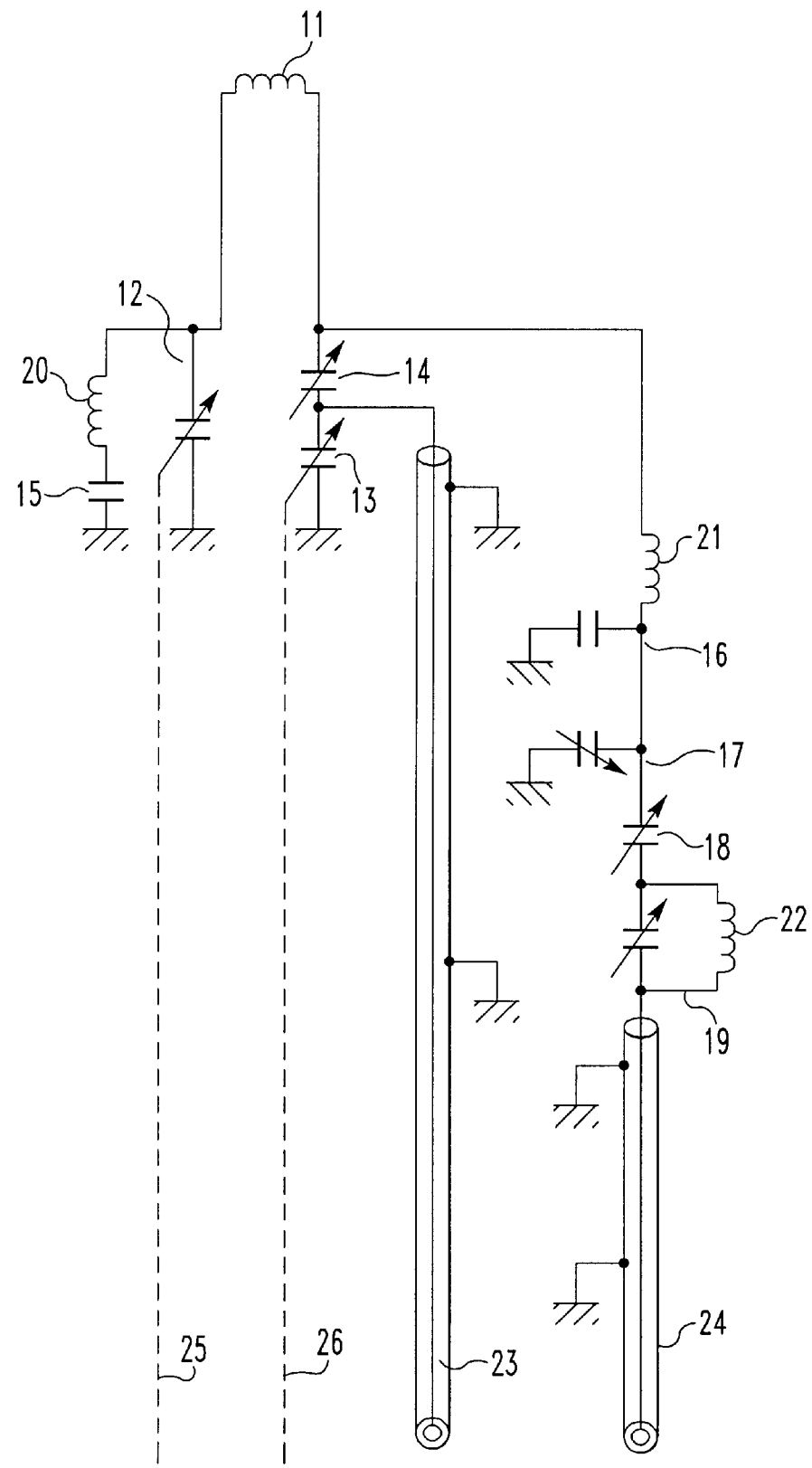
FIG. 6 is a diagram of an electric circuit received in an NMR probe.

FIG. 6 is an example of the electric circuit received in an NMR probe. In this example, a $^1$H-$^2$D double tuning circuit using a detector coil 11 to detect $^1$H nuclei (proton) and $^2$D nuclei (deuterium) is shown. Signals derived from $^2$D nuclei are used as a locking signal in an NMR lock employed to prevent drift of the magnetic field.

Referring to FIG. 3, with respect to $^1$H nuclei requiring a high resonance frequency, an LC resonance circuit is formed by the detector coil (transmitter-receiver coil) 11, a tuning variable capacitor 12, a matching variable capacitor 13, and a matching variable capacitor 14. The matching variable capacitors 13 and 14 perform impedance transformation to transmit NMR signals to the outside at a high efficiency via a coaxial cable 23 for $^1$H. If a sample 27 is put in the detector coil 11, the dielectric constant of the sample shifts the resonance frequency and the impedance. Therefore, it is necessary to adjust the capacitances of the tuning variable capacitor 12 and the matching variable capacitor 13 from outside. Consequently, a shaft 25 for $^1$H tuning and a shaft 26 also for $^1$H matching are mounted to the capacitors, respectively. These shafts extend to the outside.

With respect to the $^2$D nuclei producing a lower resonance frequency, an LC resonance circuit is formed by a capacitor 15, a coil 20, the detector coil 11, a coil 21, a capacitor 16, a tuning variable capacitor ($^2$D) 17, and a matching variable capacitor ($^2$D) 18. The matching variable capacitor ($^2$D) 18 performs an impedance transformation in the same way as in the case of $^1$H nuclei. Signals are transmitted to the outside through a coaxial cable 24 for $^2$D.

In the case of a $^1$H-$^2$D double tuning circuit, if a signal of $^1$H resonance frequency is passed to the $^2$D coaxial cable 24 from the $^1$H coaxial cable 23, deterioration of the detection sensitivity for $^1$H nuclei and other problems will take place. Accordingly, to block passage of signals, a trap circuit for $^1$H resonance frequency is formed by a variable capacitor 19 and a coil 22.

The aforementioned cylindrical electrode 50 is provided with windows 51a and 51b just sized to permit electrical parts and a detector coil to be entered from outside and to enable an assembly operation. After completion of the assembly, the windows 51a and 51b are closed by a cover 52. A metal fixture 29 is mounted to the bottom of the detector for mounting to the superconducting magnet, for fixing of a coaxial cable, and for fixing of necessary connectors. The front end of the cylindrical electrode 50 is clogged up by a cap 40 that is centrally formed with an insertion port for a sample. As shown in FIG. 5, the probe is inserted into a superconducting coil 61 until the front end of the cylindrical electrode 50 reaches the interior of the coil 61 that is placed within a superconducting magnet 60. Then, the probe is fixedly mounted there.

Figure 7A:
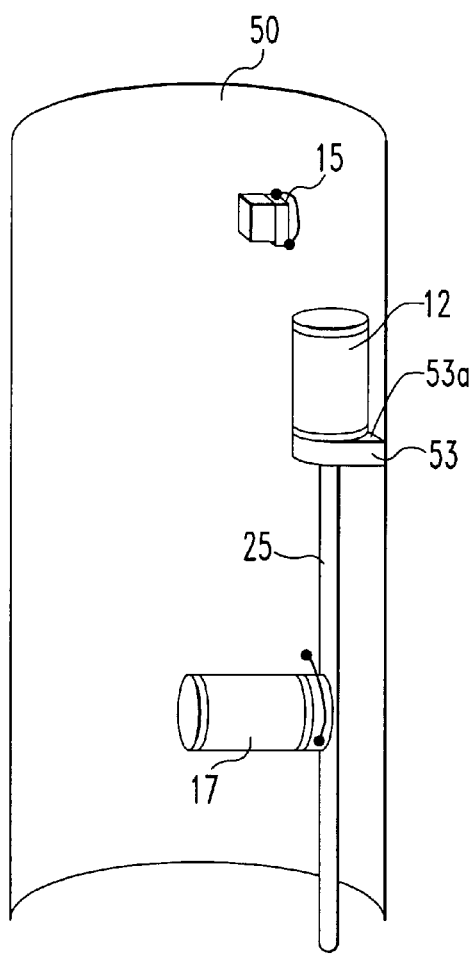
FIG. 7(a) is a stereophotograph of a capacitor mounted on the inner surface of a cylindrical electrode 50 of an NMR probe in accordance with the present invention.
Figure 7B:
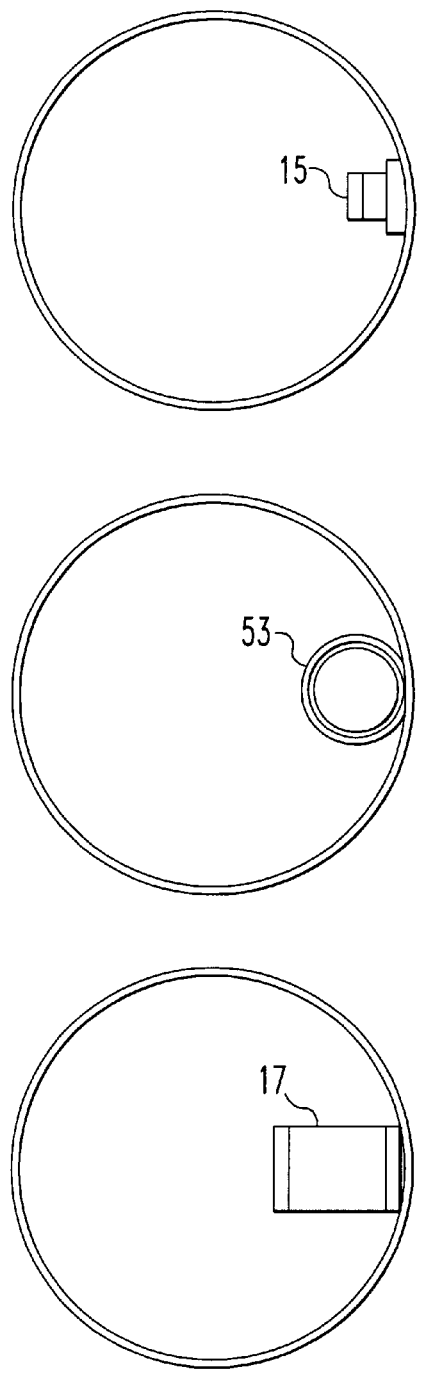
FIG. 7(b) is a cross-sectional view showing the manner in which the capacitor shown in FIG. 7(a) is mounted.

As shown in FIG. 4(a), electrical parts are directly attached to the inner surface of the cylindrical electrode 50. As shown in the circuit diagram of FIG. 6, it is necessary to ground one side of each electrode. Accordingly, as shown in FIGS. 7(a) and 7(b), one electrode of the capacitor 15 is directly soldered to the inside of the cylindrical electrode 50 that is ground for the electric circuit. In the case of the variable capacitors 12 and 13, it is necessary to mount the shafts 25 and 26 axially of the cylinder to permit adjustment from outside. Therefore, as shown in FIG. 7, an auxiliary electrode 53 having a flat portion 53a on which the variable capacitors are mounted is used. The auxiliary electrode 53 is soldered or otherwise mounted to a desired location on the inside of the cylindrical electrode 50 in a vertical relation to the axis of the cylinder. The variable capacitors 12 and 13 are soldered to the flat portion 53a in such a way that their manually operated shafts are oriented in the axial direction of the cylinder. In the case of the variable capacitor 17, it is not necessary that the shaft extend outwardly. Therefore, as shown in FIG. 7(b), one electrode is soldered to a desired location on the inside of the cylindrical electrode 50.

Figure 8A:
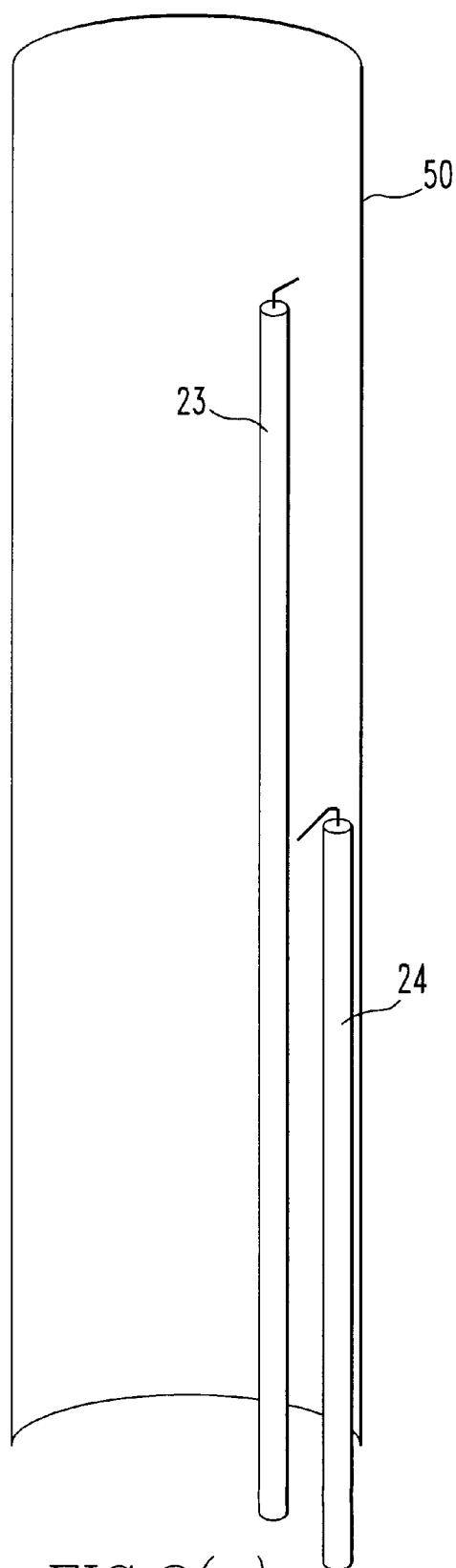
FIG. 8(a) is a stereophotograph of a coaxial cable mounted to the inner surface of the cylindrical electrode 50.
Figure 8B:
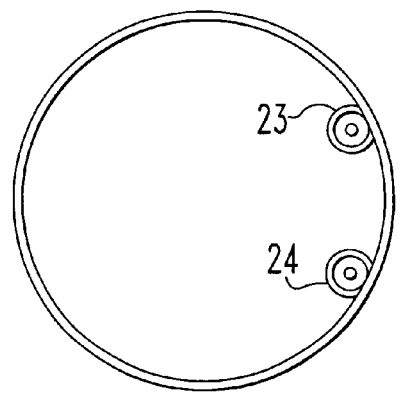
FIG. 8(b) is a cross-sectional view showing the manner in which the capacitor shown in FIG. 8(a) is mounted.

As shown in FIGS. 8(a) and 8(b), the coaxial cables 23 and 24 are also soldered to the inside of the cylindrical electrode 50. Especially, in the vicinity of the electrical part at the top of the detector, the soldering operation is performed so as not to form a gap between the inner wall of the cylindrical electrode and the external conductor of the coaxial cable.

The center axis of the detector coil 11 wound around the surface of a bobbin 41 needs to be aligned with the center axis of the cylindrical electrode. For this purpose, a partition plate 32 is mounted inside the cylindrical electrode 50 perpendicularly to the axis of the cylinder. This partition plate 32 corresponds to the support in the first embodiment. The partition plate 32 consists of a dielectric base material in the form of a disk plated with a highly conductive metal in the same way as the support. In particular, the base material is electrodelessly plated (chemical plating) (primary processing). The plating layer is further electrically plated such that every portion is coated with a thin plating layer. The partition plate is soldered, for example, to the cylindrical electrode to electrically connect the plating layer on the surface with the cylindrical electrode.

Thus, the dielectric disk forming the partition plate 32 is completely shielded from the RF magnetic field, thus preventing generation of background signals from the disk. Since this plating layer is quite thin (say, on the order of micrometers), the uniformity of the static magnetic field is hardly affected. Hence, NMR can be measured at a high resolution.

After fabricating the partition plate 32 in this way, the bobbin 41 is mounted on the partition plate 32 such that the center axis of the coil is coincident with the axis of the cylinder.

An air tube 30 is made of glass or resin. Therefore, it is not necessary to take account of grounding. The air tube 30 is supported on its bottom by the metal fixture 29 and on its top by the partition plate 32. This partition plate 32 has a channel and a hole. The channel acts to supply air carried by the air tube 30 into the bobbin 41. The hole permits passage of a conductor that connects the detector coil 11 to the underlying electric circuit.

Figure 10:
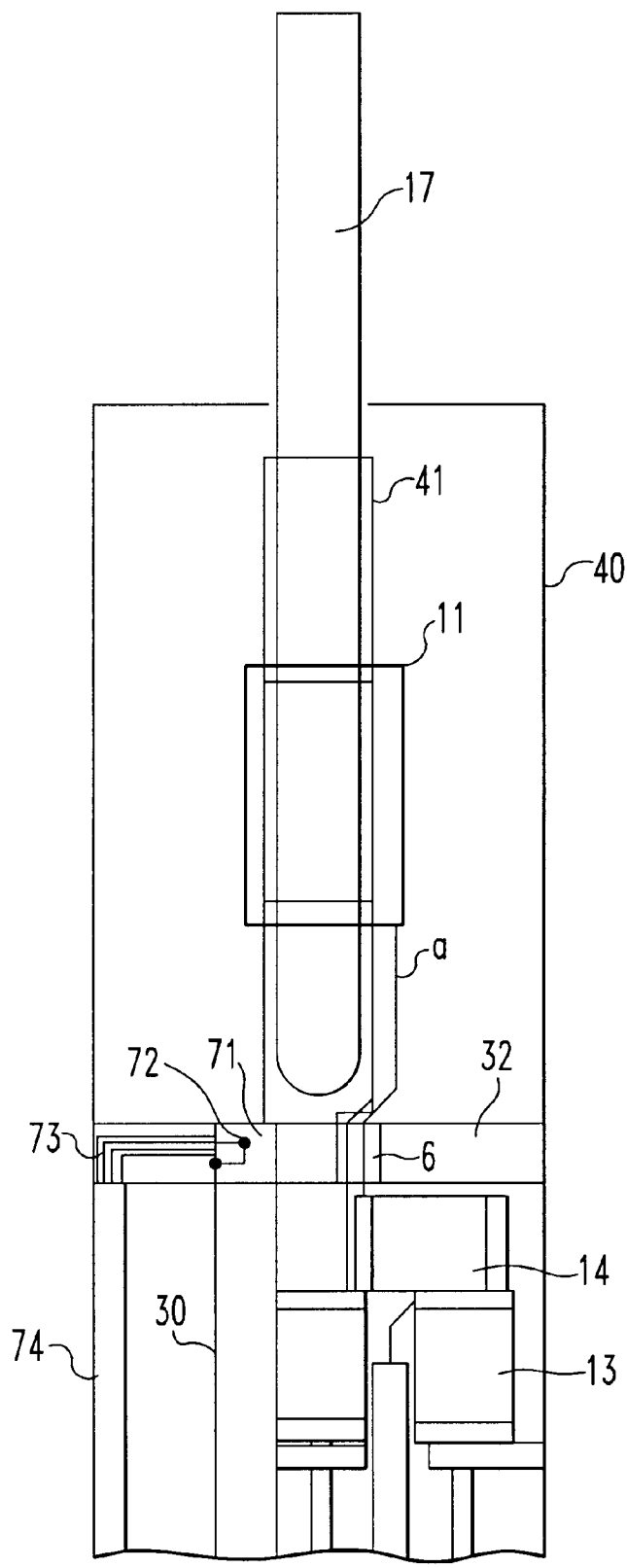
FIG. 10 is an enlarged cross-sectional view of the portions around the partition plate 32.

FIG. 10 shows an enlarged cross-sectional view of portions around a partition plate 32. One end of the air tube is connected with the channel 71 and the temperature-controlled air carried by the air tube 30 is supplied into the bobbin 41 through the channel 71. A thermocouple 72 is arranged in the channel 71. The junction portion of the thermocouple 72 is grounded by a short lead wire. Two wires of the thermocouple are extracted from the lower surface of the partition plate 32 through a hole bored in the partition plate 32. The wires are further extracted outside of the probe through a shield pipe 74 electrically connected to the cylindrical electrode 50 by soldering, for example. The intermixing of noise signal into the detection signal from the thermocouple is decreased by grounding the junction portion of the thermocouple through the short lead wire. Also, the intermixing of noise signal is decreased by the effect of electromagnetic shielding of the shield pipe 74 which covers the wires from the thermocouple.

Figure 9:
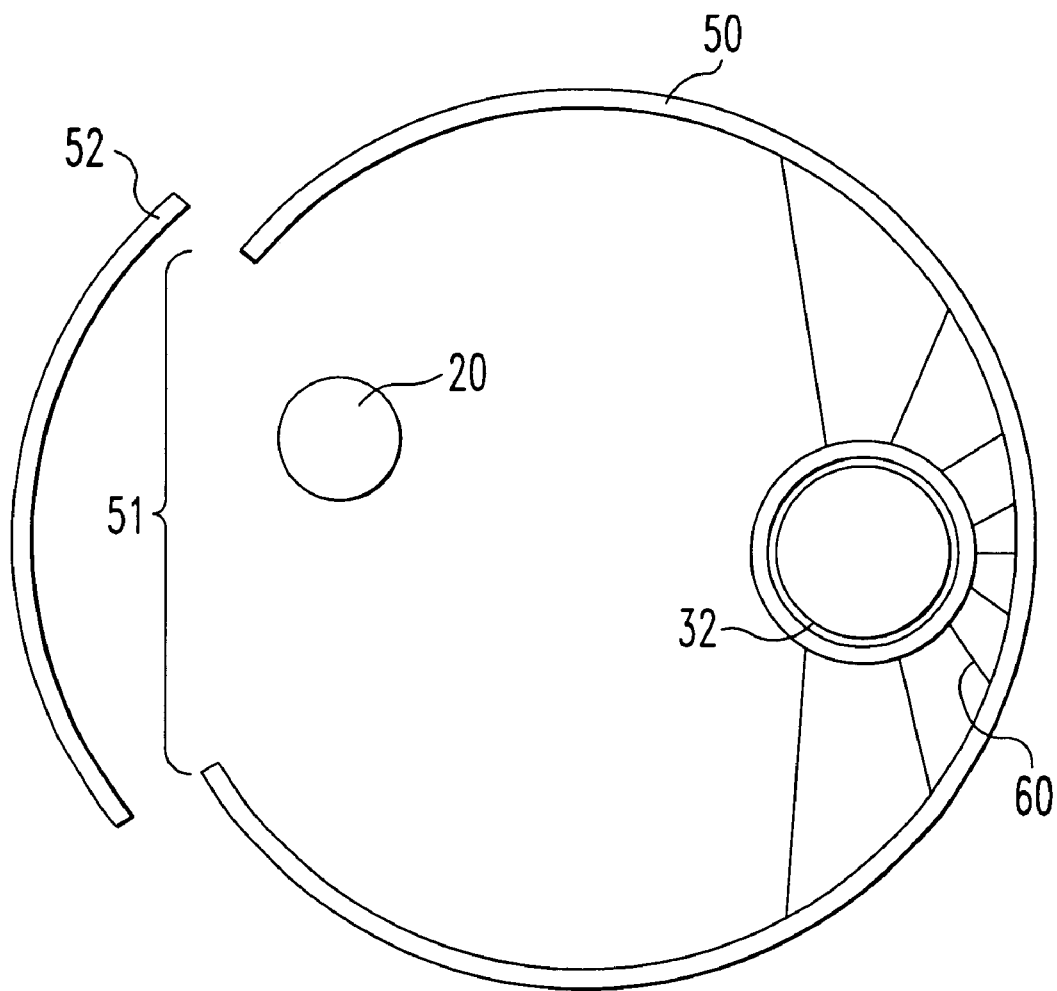
FIG. 9 is a view showing the distribution of lines of electric force produced between the cylindrical electrode 50 and an electrical part 42.

FIG. 9 shows the distribution of lines of electric force generated between the cylindrical electrode 50 and the electrical part 42. In this figure, the lines of electric force 60 generated by the electrical part 42, such as a variable capacitor to the surroundings during operation of the circuit, are indicated by broken lines. As a window 51 enlarges, the operability improves. However, if the size or the position is not appropriate, the RF electric field produced around the electrical part leaks to the outside through the window 51. Under this state, if the cover 52 is mounted so as to close the window 51, an RF current flows between the cover 52 and the cylindrical electrode 50. The contact resistance between the cover 52 and the cylindrical electrode 50 presents a problem. That is, the advantage derived by using the cylindrical frame is undone. A similar problem takes place where the RF magnetic field leaks.

Therefore, as the frequency of a signal passing through a part becomes higher, it is necessary to place the part more remotely from the window 51 as shown in FIG. 9.

On the other hand, the air tube 30 and so on that are not associated with electric circuitry can be placed anywhere without trouble. Therefore, where the air tube 30 is placed closer to the window 51, effective use of the space can be made. Leakage of the RF electric field (lines of electric force) has been taken as an example. Where a coil component or the like is mounted, leakage of generated magnetic field (lines of magnetic force) needs to be taken into consideration similarly. Again, the coil component is preferably placed remotely from the window 51, i.e., on the opposite side of the cylindrical electrode 50 from the window 51.

Although the cover 52 is not associated with the function of the detector, shielding is necessary to prevent leakage of electromagnetic fields into and out of the cover and to protect the part. For the shielding, it is desired to connect the cover 52 and the cylindrical electrode 50 via a low resistance. In this case, soldering is the easiest method of connection.

In the NMR probe constructed as described thus far, the cylindrical electrode 50 is provided with the small window 51 to permit mounting of a part. Since the cylinder has a sufficient surface area, the cylinder acts as ground for sufficiently small impedances at RF frequencies. Because the cylindrical electrode 50 for the electrical part is grounded, the electrical circuit operates exactly according to the circuit diagram of FIG. 6.

It is to be understood that the present invention is not limited to the above embodiments but rather various changes and modifications are possible. For example, the electrode 50 is not limited to a cylinder. It may also take a hollow tubular form capable of accommodating a part. The cross section may be polygonal.

Furthermore, it is not necessary to adopt the configuration of the present invention for the whole probe. Sufficient advantages can be obtained by adopting the configuration of the present invention only for the front-end portion that accommodates an electric circuit.

The shape and the size of the auxiliary electrode 53 mounted inside the cylindrical electrode 50 for mounting variable capacitors can be set at will. If a relatively large auxiliary electrode is used, plural variable capacitors can be mounted to a single auxiliary electrode.

If the cylindrical electrode 50 is provided with a hole extending to the location where an electrical part is attached, an operation for soldering the electrical part can be performed from outside. In the case of a cable, the electrode may be provided with holes spaced from each other at appropriate intervals.

Where a magnetic field gradient coil is mounted inside the detector, a shielding pipe is used to shield the conductors of DC cables that are used to connect the gradient coil with a DC power supply. If this shielding pipe is mounted to the inner wall of the cylindrical wall by soldering or other method in the same way as in the case of the coaxial cable, the capability of shielding electromagnetic waves is improved.

The cover 52 may be split into plural parts. The configuration shown in FIG. 9, i.e., an electrical part is mounted remotely from the window 51, is difficult to achieve where the electric circuit is complex and a large number of electrical parts are installed. Where it is necessary to mount electrical parts near the window, the cover 52 is divided into several small parts and directly soldered to the cylindrical electrode 50. This prevents RF magnetic and electric fields from leaking to the outside.

Alternatively, the cover 52 may be shaped cylindrically and placed over the cylindrical electrode 50 to close the window. In summary, the cover 52 is only required to close the window; the cover may be shaped into any desired form.

As described thus far, in the NMR probe in accordance with the present invention, a support to which a bobbin for holding a detector coil is mounted is made of a dielectric material plated with a metal. Therefore, no background signal is produced. Good heat resistance is obtained. The uniform static magnetic field is not perturbed. Also, the dielectric loss is small. Consequently, the Q factor is not deteriorated. The probe is easy to machine. In consequence, NMR measurements can be performed under good variable-temperature conditions.

In a second embodiment of the present invention, an NMR probe comprises a frame fabricated from a cylindrical electrode. The use of the cylindrical electrode yields the following advantages.

(a) A high resonance frequency is obtained. Since any inductive or capacitive component that is unnecessary for an LC resonance circuit is not added, a high resonance frequency can be derived.

(b) The efficiency at which an NMR signal is detected is improved. Because electric power consumed by extra impedance decreases, attenuation of the output signal from a detector can be prevented. Hence, the detection efficiency is enhanced. If extra impedance were present, undesired resonance mode would be produced, thus deteriorating the efficiency of the circuit.

(c) Malfunctions of the electric circuit due to bad contact of ground are reduced. Since electrical parts including capacitors are directly soldered to the cylindrical electrode that is ground, bad contacts are reduced. Also, variations in the resonance frequency are reduced greatly. Consequently, adjustment is facilitated.

(d) The number of components is reduced. Since the conventional frame of the complex structure is replaced by the cylindrical electrode, the number of components is reduced greatly. In addition, the space in which electrical parts and mechanical parts can be installed is enlarged.

Having thus described our invention with the detail and particularity required by the Patent Laws, what is desired protected by Letters Patent is set forth in the following claims.

What is claimed is:

1. An NMR probe comprising:
    a sample bobbin;
    a detector coil mounted on a surface of said sample bobbin having an extraction line leading away from the detector coil; and
    a support for supporting said sample bobbin, said sample bobbin having a through-hole for passage of the extraction line, and said support having all surfaces thereof including the through-hole surfaces plated with a metal.

2. The NMR probe of claim 1, wherein said support is made of material having a low magnetic susceptibility.

3. The NMR probe of claim 2, wherein said support is made of glass-epoxy or quartz glass.

4. The NMR probe of claim 1 or 2, wherein an extraction line extends from said detector coil, and wherein said support has a bushing provided with a hole to pass said extraction line, said hole having a diameter substantially equal to that of said extraction line.

5. The NMR probe of claim 4, wherein said bushing is made of quartz glass or other insulative material having a low magnetic susceptibility.

6. An NMR probe having an NMR detector coil and at least one capacitor combined with said detector coil, said NMR probe comprising:
    a cylindrical grounding electrode surrounding the outside of said NMR probe and having an inside space;
    a partition plate for partitioning the inside space of said cylindrical grounding electrode into plural parts, said partition plate including a material that would generate background NMR noise and consisting of an insulator, every surface of said partition plate being coated with a conductive metal, said NMR detector coil being mounted to said partition plate;
    said cylindrical grounding electrode having an inner surface electrically connected with said partition plate; and
    said capacitor having one electrode mounted to the inner surface of said cylindrical electrode or to said partition plate.

7. The NMR probe of claim 6, wherein said cylindrical electrode has a window for placing inside and outside of the probe in communication with each other.

8. The NMR probe of claim 6 or 7, wherein one electrode of said capacitor is directly soldered to the inner surface of said cylindrical electrode.

9. The NMR probe of any one of claims 6 or 7, wherein said capacitor has a fixed capacitance.

10. The NMR probe of any one of claims 6 or 7, wherein said capacitor has a variable capacitance.

11. The NMR probe of any one of claims 6 or 7, wherein a coaxial line having an outer conductor connects said coil with an external circuit, and wherein said outer conductor of said coaxial line is mounted to the inner surface of said cylindrical electrode.

12. The NMR probe of claim 10, wherein an auxiliary electrode is mounted to the inner surface of said cylindrical grounding electrode and has a capacitance that is varied by a driving shaft extending axially of said cylindrical electrode and outwardly of a detector, and wherein one electrode of said variable capacitor is mounted to said auxiliary capacitor.

13. The NMR probe of claim 6 or 7, wherein said partition plate has a channel through which a gas for temperature control is supplied and in which a thermocouple for detecting the temperature of the gas.

14. The NMR probe of claim 13, wherein the junction portion of the thermocouple is grounded to the partition plate by a lead wire.

15. The NMR probe of claim 13, wherein two wires of the thermocouple are extracted from the probe through a hole bored in the partition plate and a shield pipe electrically connected to the cylindrical electrode.

* * * * *

UNITED STATES PATENT AND TRADEMARK OFFICE
CERTIFICATE OF CORRECTION

PATENT NO. : 6,329,820 B1
DATED : December 11, 2001
INVENTOR(S) : Kenichi Hasegawa et al.

It is certified that error appears in the above-identified patent and that said Letters Patent is hereby corrected as shown below:

<u>Title page,</u>
Item [30], Foreign Application Priority Data, "Nov. 19, 1998" should read -- Nov. 27, 1998 --.

Signed and Sealed this

Seventh Day of May, 2002

Attest:

Attesting Officer

JAMES E. ROGAN
*Director of the United States Patent and Trademark Office*